United States Patent [19]

Kuwabara

[11] Patent Number: 5,195,113
[45] Date of Patent: Mar. 16, 1993

[54] X-RAY EXPOSURE APPARATUS AND METHOD OF POSITIONING THE SAME

[75] Inventor: Osamu Kuwabara, Yokohama, Japan

[73] Assignee: Kabushiki Kaisha Toshiba, Kawasaki, Japan

[21] Appl. No.: 766,175

[22] Filed: Sep. 27, 1991

[30] Foreign Application Priority Data

Sep. 28, 1990 [JP]  Japan ................................ 2-259646

[51] Int. Cl.⁵ .............................................. G21K 5/00
[52] U.S. Cl. ..................................... 378/34; 378/205; 378/208
[58] Field of Search .................... 378/34, 35, 204, 205, 378/208; 250/492.2 R, 492.3, 491.1

[56] References Cited

U.S. PATENT DOCUMENTS

| | | | |
|---|---|---|---|
| 4,525,852 | 6/1985 | Rosenberg | 378/34 |
| 4,617,681 | 10/1986 | LaFiandra et al. | 378/34 |
| 4,803,712 | 2/1989 | Kembo et al. | 378/34 |
| 4,979,195 | 12/1990 | Tabata et al. | 378/34 |
| 5,073,912 | 12/1991 | Kobayashi et al. | 378/34 |

FOREIGN PATENT DOCUMENTS

1-282817  1/1989  Japan.
2-72611   2/1990  Japan.
2-174112  2/1990  Japan.

*Primary Examiner*—David P. Porta
*Attorney, Agent, or Firm*—Foley & Lardner

[57] ABSTRACT

An X-ray exposure apparatus comprises an X-ray beam generating source and an exposure apparatus body including an alignment optical system. The exposure apparatus body is set independently from the X-ray beam generating source and the exposure apparatus body is located to be swingable with respect to the base such as a floor, through the elastic member. Thereafter, the exposure apparatus body is raised by a raising mechanism, for example, comprising a plurality of vertically expandable air cushions, in a floating manner. A height position and an inclination of the exposure apparatus body are adjusted by controlling the raising mechanism individually so that the axis of the X-ray beam generated from the X-ray source substantially coincides with the optical axis as measurement reference of the alignment optical system. The exposure apparatus body is then secured to this adjusted position by means of the securing mechanism comprising adjusting bolts and clamping bolts, for example.

9 Claims, 4 Drawing Sheets

X-RAY EXPOSURE APPARATUS AND METHOD OF POSITIONING THE SAME

BACKGROUND OF THE INVENTION

The present invention relates to an X-ray exposure apparatus, and particularly, to one capable of effectively adjusting an alignment of an axis of radiated X-ray beams of the X-ray exposure apparatus with an optical axis of an optical alignment system of the X-ray exposure apparatus and a method of positioning the X-ray exposure apparatus.

In a known technology, a light exposure device has been generally utilized for forming a large scale integrated circuit (LSI) pattern, but recently, the formation of patterns by light exposure device has approached its limit in resolution for the requirement of the formation of extremely fine LSI patterns.

In view of this limit, recently, an X-ray exposure apparatus capable of forming a fine LSI pattern in comparison with the light exposure device are being searched and developed. The X-ray exposure device requires an X-ray source provided with high luminance and, in this viewpoint, an attention has been paid to synchrotrons as X-ray sources.

A conventional X-ray exposure apparatus provided with a synchrotron as the X-ray source will be described hereunder.

X-ray beams generated from the synchrotron are reflected by a reflecting mirror and then enter a chamber of an exposure apparatus body of the exposure apparatus. The interior of the chamber is of a helium atmosphere for preventing the X-ray beams from being attenuated, and in the inside of the chamber are accommodated a mask stage holding an X-ray mask that is movable, a wafer stage holding a semiconductor wafer to be movable and an alignment optical system for detecting a positional offset between patterns described on the X-ray mask and the semiconductor wafer.

According to this structure of the X-ray exposure apparatus, X-ray beams entering the chamber of the X-ray exposure apparatus body are irradiated on the X-ray mask, and then irradiated on the surface of the semiconductor wafer to thereby expose a circuit pattern of the X-ray mask onto the semiconductor wafer.

The exposure apparatus body is mounted on an oscillation removing table which is set on a floor through an elastic member such as air spring, thus effectively preventing the exposure apparatus body from being oscillated or affected by an external shock or the like from the floor.

The X-ray beams obtained by a synchrotron orbit radiation (SOR) constitute horizontal linear beams irradiated in a horizontal direction. In order to enlarge an irradiated area for carrying out an exposure transfer of the circuit pattern of the X-ray mask onto the semiconductor wafer, an X-ray reflecting mirror is arranged between the synchrotron and the exposure apparatus body, and the X-ray beams are swinged by swinging the reflecting mirror.

Furthermore, in order to transfer the circuit pattern on the X-ray mask onto the semiconductor wafer in a precisely overlapped manner, it is required that the alignment optical system and an exposure optical system for the transfer be stably constructed with a predetermined performance. This requirement, in one example, is achieved by assembling, for adjustment with mechanically high precision, the mask stage, the wafer stage and the alignment optical system as the exposure apparatus body.

For the reason described above, in the X-ray exposure apparatus utilizing the SOR, the adjustment of the axes of the X-ray beams and the alignment optical system are required to have high precision.

In other words, in order to carry out transferring, in a precisely overlapped state, the circuit pattern on the X-ray mask to the semiconductor wafer on which a resist is coated, it is necessary to adjust the positions of the X-ray mask and the semiconductor wafer so as not to have a positional offset between a position of a mask pattern and a position of a pattern to be formed on the semiconductor wafer. Namely, the precise coincidence of the optical axis of the X-ray beams with an optical axis, as measurement reference, of the alignment optical system is required. In the case of no coincidence, a positional offset is caused in an amount such as shown by the following equation, $$\delta = G \times \Delta\theta$$

in which G is a gap between the X-ray mask and the semiconductor wafer, and $\Delta\theta$ is an angular difference between the axis of the beam and the axis of the alignment optical system, and $\delta$ is an amount of positional offset.

As described above, the X-ray beams are reflected by the reflecting mirror and then enter the exposure apparatus body, so that the X-ray beams are not ordinarily parallel to the floor on which the X-ray exposure apparatus is settled and has an inclination of several angles. On the contrary, since the exposure apparatus body is precisely assembled with a horizontal plane as the reference level, the optical axis of the alignment optical system as the measurement reference is made substantially horizontal.

For this reason, in the prior art, in order to make the axis of the X-ray beams coincident with the optical axis of the alignment optical system as the measurement reference, there is provided a method wherein two parallel X-ray reflecting mirrors are arranged with a predetermined distance therebetween between the synchrotron and the exposure apparatus body to thereby reflect the X-ray beams twice by the two reflecting mirrors to obtain horizontal light beams. In another method, an angle of the X-ray reflecting mirror is generally adjusted in accordance with the arranged position and the inclination of the exposure apparatus body.

In the former prior art method, however, since the X-ray beams are twice reflected by the two X-ray reflecting mirrors, the X-ray beams are largely attenuated. However, in the latter prior art method, since the inclination of the X-ray reflecting mirror is offset with respect to the optimum inclination according to the location or inclination of the exposure apparatus body, the X-ray beams cannot be effectively utilized, and hence the function of the X-ray exposure apparatus utilizing the SOR cannot be adequately attained.

SUMMARY OF THE INVENTION

An object of the present invention is to substantially eliminate defects or drawbacks encountered in the prior art and to provide an X-ray exposure apparatus and a method of positioning the same, capable of easily achieving the coincidence of an axis of an X-ray beam generated with an optical axis of an alignment optical system of an exposure apparatus body by utilizing one reflecting mirror with an optimum reflecting angle being maintained.

This and other objects can be achieved according to the present invention, in one aspect, by providing an X-ray exposure apparatus comprising an X-ray beam generating source such as a synchrotron, an exposure apparatus body disposed independently from the X-ray generating source, the exposure apparatus body including an outer casing defining an exposure chamber, an alignment optical system accommodated in the exposure chamber, an oscillation removing member disposed on a base for supporting the exposure apparatus body to be swingable thereto, a raising mechanism mounted on the oscillation removing member for raising the exposure apparatus body in a floating manner and adjusting a height position and an inclination thereof so that an optical axis of the alignment optical system substantially coincides with an axis of an X-ray beam generated from the X-ray source, and a securing mechanism for securing the exposure apparatus body after the adjustment in position and inclination thereof.

In a preferred embodiment, the raising mechanism comprises an air cushion device secured to the oscillation removing member and expandable vertically so as to raise the exposure apparatus body in a floating manner, and the air cushion device comprises a plurality of air cushions disposed at predetermined portions on the oscillation removing member, the air cushions being adjustable in a desirable expanded height individually by adjusting an amount of air to be supplied thereinto.

In another aspect, there is provided a method of positioning an X-ray exposure apparatus comprising an X-ray beam generating source and an exposure apparatus body supported on an oscillation removing member and including an alignment optical system, the method comprising the steps of raising the exposure apparatus body in a floating manner by a raising mechanism, adjusting a height position and an inclination of the exposure apparatus body by controlling the raising mechanism so that an axis of an X-ray beam generated from the X-ray generating source substantially coincides with an optical axis, as a measurement reference, of the alignment optical system, and securing the exposure apparatus body to the height position and the inclination adjusted by a securing mechanism.

According to the present invention described above, the exposure apparatus body is set independently from the X-ray beam generating source and the exposure apparatus body is located to be swingable with respect to the base such as the floor through the elastic member. Thereafter, the exposure apparatus body is raised by the raising mechanism in a floating manner and the height position and the inclination of the exposure apparatus body are adjusted so that the axis of the X-ray beam generated from the X-ray source substantially coincides with the optical axis as measurement reference of the alignment optical system. The exposure apparatus body is then secured to this adjusted position by means of the securing mechanism.

DESCRIPTION OF THE PREFERRED EMBODIMENTS

For a better understanding of the present invention, a conventional X-ray exposure apparatus will be first described with reference to FIGS. 3 and 4.

Figure 3:
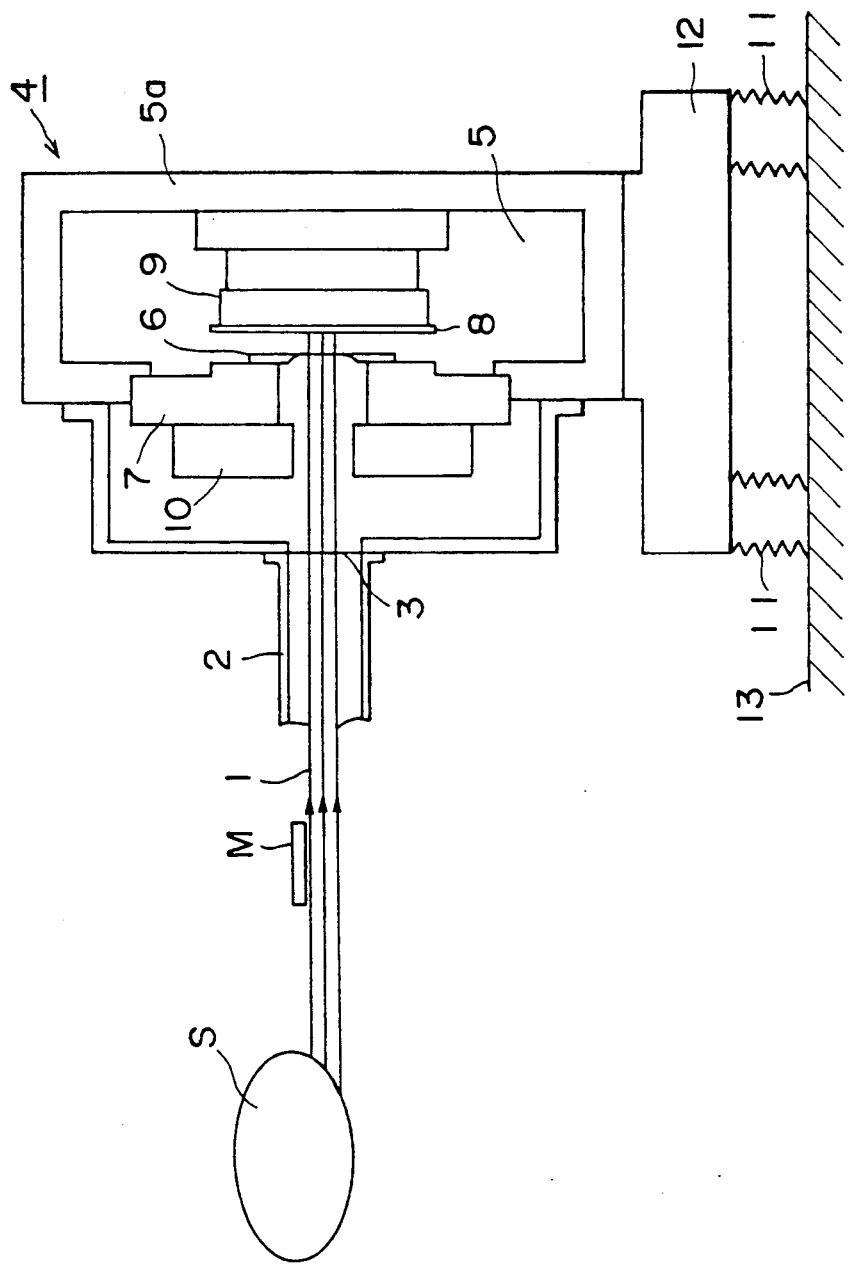
FIG. 3 is an elevational section of a conventional X-ray exposure apparatus.

Referring to FIG. 3, X-ray beams 1 irradiated from a synchrotrons, are reflected by a reflecting mirror M. The X-ray beams 1 enter a chamber 5 defined by a casing 5a of an exposure apparatus body 4 through a port 2 under an extremely high vacuum state and an X-ray take-out window 3 formed at a front end of the port 2. The interior of the chamber 5 is of a helium atmosphere for preventing the X-ray beams 1 from being attenuated, and in the inside of the chamber 5 are accommodated a mask stage 7 holding an X-ray mask 6 to be movable, a wafer stage 9 holding a semiconductor wafer 8 to be movable and an alignment optical system 10 for detecting a positional offset between patterns described on the X-ray mask 6 and the semiconductor wafer 8.

According to this structure of the X-ray exposure apparatus, the X-ray beams 1 entering the chamber 5 of the exposure apparatus body 4 are irradiated on the X-ray mask 6, through which then irradiated on the surface of the semiconductor wafer 8 thereby to expose a circuit pattern of the X-ray mask 6 onto the semiconductor wafer 8.

The exposure apparatus body 4 is mounted on an oscillation removing table 12 which is set on a floor 13 as a reference base through an elastic member such as an air spring 11, thus effectively preventing the exposure apparatus body 4 from being oscillated or affected by external shock or the like from the floor 13.

The X-ray beams 1 obtained by a synchrotron orbit radiation (SOR) constitute horizontal linear beams irradiated in a horizontal direction. In order to enlarge an irradiated area for carrying out an exposure transfer of the circuit pattern of the X-ray mask 6 onto the semiconductor wafer 8, the X-ray reflecting mirror M is arranged between the synchrotrons and the exposure apparatus body 4, and the X-ray beams 1 are swinged by swinging the reflecting mirror. The reflected X-ray beams 1 from the X-ray reflecting mirror M have an angle twice the incident angle $\alpha$ of the incident X-ray beams 1 with respect to the incident X-ray beams 1.

Furthermore, in order to transfer the circuit pattern on the X-ray mask 6 onto the semiconductor wafer 8 in a precisely overlapped manner, it is required that the alignment optical system 10 and the exposure optical system for the transfer be stably constructed with a predetermined performance. This requirement, in one example, is achieved by assembling, for adjustment with mechanically high precision, the mask stage 7, the wafer stage 9 and the alignment optical system 10 as the exposure apparatus body.

For the reason described above, in the X-ray exposure apparatus utilizing the SOR, the adjustment of the axes of the X-ray beams 1 and the alignment optical system 10 are required to have high precision.

Figure 4:
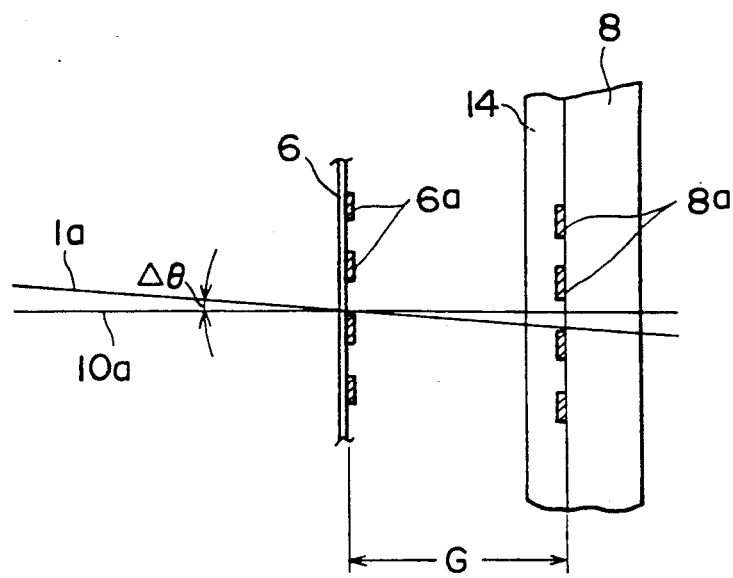
FIG. 4 is an enlarged view of an exposure portion of FIG. 3.

In other words, as shown in FIG. 4, in order to carry out the transferring, in a precisely overlapped state the circuit pattern on the X-ray mask 6 to the semiconductor wafer 8 on which a resist 14 is coated, it is necessary to adjust the positions of the X-ray mask 6 and the semiconductor wafer 8 so as not to have a positional offset between a position of a mask pattern and a position of a pattern to be formed on the semiconductor wafer 8. Namely, the precise coincidence of the optical axis 1a of the X-ray beams 1 with an optical axis 10a, as measurement reference, of the alignment optical system 10 is required. In the case of no coincidence, a positional offset is caused in an amount such as shown by the following equation, $$\delta = G \times \Delta\theta$$

in which G is a gap between the X-ray mask 6 and the semiconductor wafer 8, and $\Delta\theta$ is an angular difference between the axis 1a of the beam 1 and the axis 10a of the alignment optical system 10, and $\delta$ is an amount of positional offset.

As described above, the X-ray beams 1 are reflected by the reflecting mirror and then enter the exposure apparatus body 4, so that the X-ray beams 1 are not ordinarily parallel to the floor 13 on which the X-ray exposure apparatus is settled and has an inclination of several angles. On the contrary, since the exposure apparatus body 4 is precisely assembled with a horizontal plane as the reference level, the optical axis 10a of the alignment optical system 10 as the measurement reference is made substantially horizontal.

For this reason, in the prior art, in order to make the axis 1a of the X-ray beams 1 coincident with the optical axis 10a of the alignment optical system 10 as the measurement reference, there is provided a method wherein two parallel X-ray reflecting mirrors are arranged with a predetermined distance therebetween between the synchrotron and the exposure apparatus body to thereby reflect the X-ray beams twice by the two reflecting mirrors to obtain horizontal light beams. In another method, an angle of the X-ray reflecting mirror is generally adjusted in accordance with the arranged position and the inclination of the exposure apparatus body.

The conventional X-ray beam exposure apparatus and method, however, has the defects or drawbacks as described hereinbefore.

The present invention conceived for eliminating these defects or drawbacks will be described hereunder with reference to FIGS. 1 and 2.

A synchrotron S is utilized for generating X-ray beams and a reflecting mirror M is disposed at a portion suitable for reflecting the X-ray beams from the synchrotron S towards the exposure apparatus body. The exposure apparatus body 4 comprises an X-ray beam guide port 2 under extremely high vacuum state and a casing 5a defining an exposure chamber 5 which is communicated with the port 2 through a window 3 formed at a front end of the port 2. Accordingly, the X-ray beams 1 reflected by the mirror M is guided into the port 2 and then enters the exposure chamber 5 through the window 3. In the interior of the exposure chamber 5, are accommodated a mask stage 7 holding an X-ray mask 6 to be movable, a wafer stage 9 holding a semiconductor wafer 8 and an alignment optical system 10, which have substantially the same structures and functions as those described with reference to FIGS. 3 and 4.

Accordingly, the X-ray beams 1 are horizontally irradiated from the synchrotron S and reflected by the reflecting mirror M with an optimum reflecting angle, i.e. the beams 1 are incident on the exposure apparatus body 4 with an incident angle $\alpha$ with respect to the horizontal plane. As described, in this embodiment, it is necessary to make an optical axis 1a of the X-ray beams 1 coincident with an optical axis 10a, as measurement reference, of the alignment optical system 10.

Figure 1:
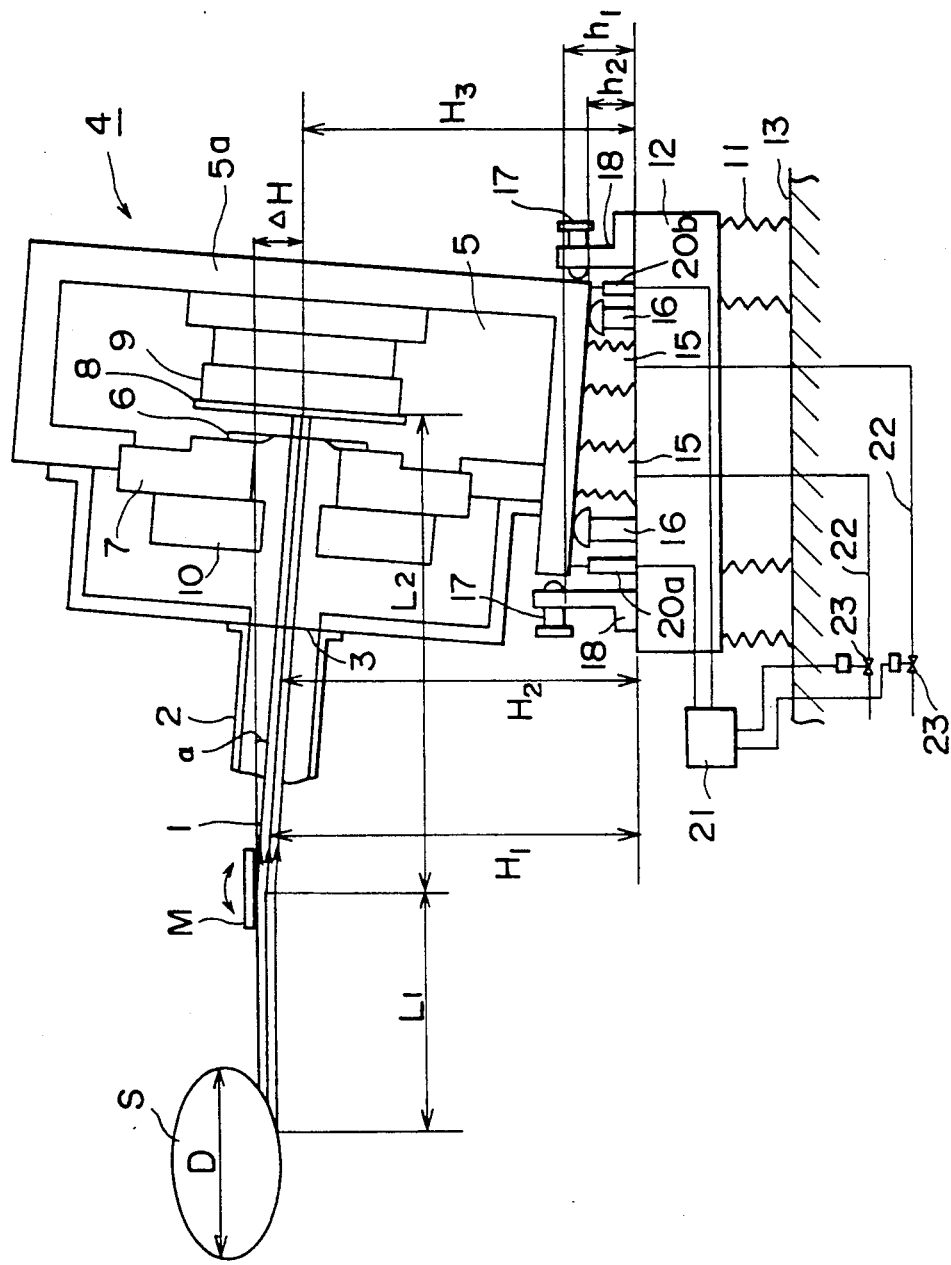
FIG. 1 is an elevational section of an X-ray exposure apparatus according to the present invention showing a state in which an exposure apparatus body is adjusted in position.
Figure 2:
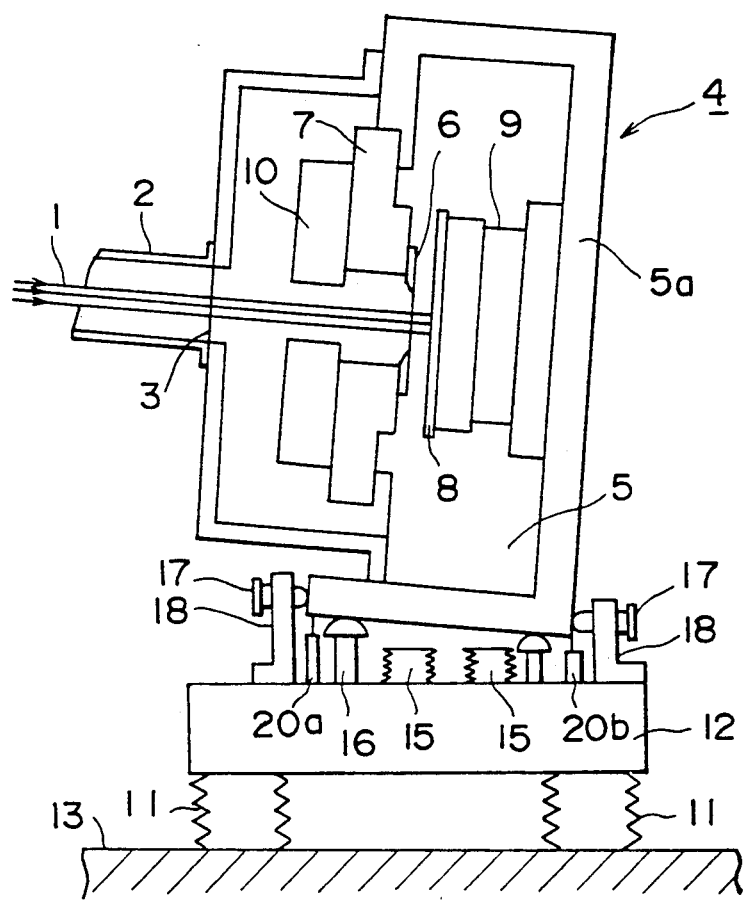
FIG. 2 is also an elevational section similar to that of FIG. 1, in which the exposure apparatus body is secured in position.

As shown in FIG. 1, a distance between the synchrotron S and the reflecting mirror M is $L_1$, a distance between the reflecting mirror M and the semiconductor wafer 8 is $L_2$, and a major axis of the synchrotron S are D. In general, $L_1 = 2-10$ m, $L_2 = 5-15$ m, and the incident angle $\alpha$ of the beams 1 on the exposure apparatus body $4 = 40-50$ mrad. In FIG. 1, for example, when $L_2 = 10$ m, the incident angle $\alpha = 50$ mrad, and $D = 20$ m, a height difference $\Delta H$ between the reflecting mirror M and the semiconductor wafer $8 = 500$ mm, an inclination of the exposure apparatus body 4 (i.e. a height difference $\Delta h$ between a front height $h_1$ and a rear height $h_2) = 50$ mm.

On the other hand, an irradiated area of the semiconductor wafer is $(20-30 \text{ mm})^2$ and an adjusted amount of the beams 1 is usually less than 1 mm. As the adjusted amount of the beams 1 is too small in comparison with the distance between the synchrotron S and the exposure apparatus body 4, it is difficult to adjust the beams 1.

When the exposure apparatus body 4 is installed on the floor 13, for example as a reference base, the exposure apparatus body 4 is supported by an oscillation removing or absorbing table 12 which is set on the floor 13 through air springs 11.

According to the present invention, a floating or raising mechanism and a securing mechanism are disposed between the exposure apparatus body 4 and the oscillation removing table 12. The raising mechanism comprises four air cushions 15 for raising the exposure apparatus body 4 in a floating manner and for adjusting the height position and inclination of the exposure apparatus body 4. The securing mechanism comprises adjusting bolts 16 and clamping bolts 17 for fixing the exposure apparatus body 4 on the oscillation removing table 12 after adjusting the height position and inclination thereof, by means of the air cushions 15.

In more detail, the four air cushions 15 are disposed on the upper surface of the oscillation removing table 12 at four corner portions of the lower surface of the exposure apparatus body 4. Each cushion 15 is individually swollen so as to expand in the vertical direction in an installed state by supplying air in the cushion 15 to thereby adjust the height of the air cushion 15. In this way, the four air cushion 15 may adjust the position and inclination of the exposure apparatus body 4.

Figure 5:
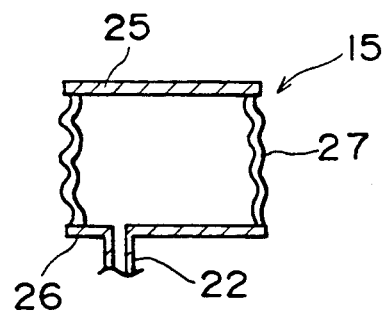
FIG. 5 is a sectional view of an air cushion of FIG. 1.

As shown in FIG. 5, the air cushion 15 has an upper plate 25, a lower plate 26, and a rubber side portion 27 connecting the upper plate 25 and the lower plate 26. Air pipes 22 are connected to the lower plates 26.

In FIG. 1, each air pipe 22 connected to the air cushion 15 has an adjusting valve 23. A front height sensor 20a and a rear height sensor 20b for measuring the front height and the rear height of the exposure apparatus body 4 are provided on the front portion and the rear portion of the oscillation removing table 12. The front height sensor 20a and the rear height sensor 20b are connected to a controller 21 which independently controls the adjusting valves 23.

The adjusting bolts 16 are secured to the oscillation removing table 12 and extend upwardly in a manner where the projecting amounts of the adjusting bolts 16 are adjustable. The upper end portions thereof are formed in spherical shapes so as to be capable of carrying the bottom of the exposure apparatus body 4 by using wider areas of the upper end portions. Otherwise, the upper end portions of the adjusting bolts 16 may be movable in a spherical motion manner. The four adjusting bolts 16 are, for example, arranged in an equilateral triangle in a plan view so that one bolt 16 is arranged at each of two points of the triangle shape and two bolts 16 are arranged at another one point thereof. Namely, the bottom of the exposure apparatus body 4 is supported at more than three supporting portions to restrict the vertical motion of the exposure apparatus body 4. The clamping bolts 17 are engaged with a bracket 18 disposed in a standing manner on the oscillation removing table 12 at a circumferential portion of the exposure apparatus body 4. The clamping bolts 17 are screwed horizontally to clamp the lower side portions of the exposure apparatus body 4 to thereby restrict the back and forth and lateral motions thereof. That is, the clamping bolts 17 prevent the exposure apparatus body 4 from moving in a horizontal plane.

The operation of positioning the exposure apparatus body 4 is as follows. First, the air is supplied into the respective air cushions 15 through the air pipes 22 in order to raise the exposure apparatus body 4 in a floating manner. Next, the height position and the inclination of the exposure apparatus body are adjusted by controlling the air amounts supplied into the respective air cushions 15, to the desirable height position and inclination where the optical axis $10a$ of the alignment optical system 10 substantially coincides with the axis $1a$ of the X-ray beams 1.

The adjustment of the exposure apparatus body 4 will be described in detail. The X-ray beams 1 are actually irradiated from the synchrotron S. Next, heights $H_1$ and $H_2$ from the oscillation removing table 12 to the beams 1 at two optional positions are measured by suitable measuring means such as a fluorescence plate or an X-ray monitor. After that, the heights $H_1$ and $H_2$ are inputted to the controller 21, and then a height $H_3$ from the oscillation removing table 12 to an exposure point of the semiconductor wafer 8 is calculated on the basis of the heights $H_1$ and $H_2$. At the same time, in the controller 21 the front height $h_1$ and the rear height $h_2$ of the exposure apparatus body 4 are calculated on the basis of the heights $H_1$ and $H_2$ so that the optical axis $10a$ of the alignment Optical system 10 coincides with the axis $1a$ of the X-ray beams 1.

On the other hand, the front height $h_1$ and the rear height $h_2$ measured by the front height sensor $20a$ and the rear height sensor $20b$ are inputted to the controller 21. Then, the respective adjusting valves 23 are controlled by the controller 21 on the basis of the calculated values and the measured values of the front height $h_1$ and the rear heights $h_2$. Thereafter, as shown in FIG. 2, the exposure apparatus body 4 is secured to the height position and the inclination adjusted in the previous step by means of the securing mechanism comprising the adjusting bolts 16 and the clamping bolts 17. Air bleeding from the respective air cushions 15 is then performed.

In this case, as shown in FIG. 4, it is possible to check whether or not the coincidence between the optical axis $10a$ as the measurement reference of the alignment optical system 10 and the axis $1a$ of the X-ray beams 1 has been adjusted to be within a required range. In the case of not being adjusted, the raising mechanism, i.e. air cushions 15 are again operated to carry out the readjustment of the coincidence of the optical axes $1a$ and $10a$. This adjustment can be carried out easily, however.

Accordingly, as described hereinbefore, according to the present invention, the exposure apparatus body which is arranged independently from the synchrotron as X-ray generating source, can have vertical and horizontal positions adjusted so as to make coincident between the axis of the X-ray beams from the synchrotron and the axis of the alignment optical system without adversely affecting on the function of the exposure apparatus as a whole.

In the described embodiment, the air cushions are utilized for raising the exposure apparatus body, but any other means such as hydraulic jack means may be utilized. Furthermore, securing members each having a tapered upper end may be substituted for the adjusting bolts having top spherical shapes and adjusting bolts may be also substituted for the clamping bolts.

It is to be understood that the present invention is not limited to the described preferred embodiment and many other changes and modifications may be made without departing from the scope of the appended claims.

What is claimed is:

1. An X-ray exposure apparatus comprising:

an X-ray beam generating source;

an exposure apparatus body disposed independently from the X-ray beam generating source, said exposure apparatus body including an outer casing defining an exposure chamber;

an alignment optical system accommodated in the exposure chamber;

supporting means disposed on a base for supporting the exposure apparatus body to be swingable thereto;

raising means mounted on the supporting means for raising the exposure apparatus body in a floating manner and adjusting a height position and an inclination thereof so that an optical axis of the alignment optical system substantially coincides with an axis of an irradiated X-ray beam; and securing means for securing the exposure apparatus body after adjusting the height position and the inclination thereof.

2. The X-ray exposure apparatus according to claim 1, wherein said supporting means comprises an oscillation removing member and an elastic member disposed between the base and the oscillation removing member and wherein said raising means comprises an air cushion means secured to the oscillation removing member and expandable vertically so as to raise the exposure apparatus body in a floating manner.

3. The X-ray exposure apparatus according to claim 2, wherein said air cushion means comprises a plurality of air cushions disposed at predetermined portions on the oscillation removing member, each air cushion being adjustable in a desirable expanded height individually by adjusting an amount of air to be supplied the air cushion.

4. The X-ray exposure apparatus according to claim 1, wherein
said securing means comprises a plurality of adjusting bolts each having one end secured to the oscillation removing member and another end formed in spherical shape so as to be capable of carrying the bottom of the exposure apparatus body on the spherical shape, a bracket arranged on the oscillation removing member and a plurality of clamping bolts screw engaged with the bracket for clamping side peripheral portions of the exposure apparatus body in a clamped manner so as to prevent the exposure apparatus body from moving in a horizontal plane.

5. The X-ray exposure apparatus according to claim 4, wherein
said adjusting bolts are disposed at more than three portions on the oscillation removing member.

6. The X-ray exposure apparatus according to claim 5, wherein
said adjusting bolts are adjustable in height positions.

7. The X-ray exposure apparatus according to claim 1, wherein
said X-ray beam generating source is a synchrotron.

8. The X-ray exposure apparatus according to claim 1, wherein
said apparatus further comprises a controller for calculating a front height and a rear height of the exposure apparatus body on the basis of at least two heights of the X-ray beam so that the optical axis of the alignment optical system substantially coincides with the axis of the irradiated X-ray beam; and height sensors provided on the supporting means for measuring an actual front height and an actual rear height of the exposure apparatus and for outputting signals to the controller, wherein
the raising means has a plurality of air cushions connected to air pipes supplying the air thereto, each pipe having an adjusting valve, and wherein
the adjusting valves are controlled by the controller on the basis of the calculated values and the measured actual values of the front height and the rear height of the exposure apparatus body.

9. A method of positioning an X-ray exposure apparatus comprising and X-ray beam generating source, supporting means and an exposure apparatus body supported on the supporting means and including an alignment optical system, the method comprising the steps of:
raising the exposure apparatus body in a floating manner by raising means on the supporting means;
adjusting a height position and an inclination of the exposure apparatus body by controlling the raising means so that an axis of an X-ray beam generated from the X-ray beam generating source substantially coincides with an optical axis, as a measurement reference, of the alignment optical system, and wherein said adjusting step further comprises,
calculating a front height and a rear height of the exposure apparatus body on the basis of at least two heights of the X-ray beam so that the axis of the X-ray beam coincides with the optical axis of the alignment optical system,
measuring an actual front height and an actual rear height of the exposure apparatus body, and
controlling the raising means on the basis of the calculated values and the measured actual values of the front height and the rear height of the exposure apparatus body; and
securing the exposure apparatus body to the height position and the inclination adjusted in the aforementioned step by securing means.

* * * * *